(12) United States Patent
Zhao et al.

(10) Patent No.: US 8,928,360 B2
(45) Date of Patent: Jan. 6, 2015

(54) HIGH FREQUENCY SMART BUFFER

(71) Applicant: STMicroelectronics R&D (Shanghai) Co. Ltd., Shanghai (CN)

(72) Inventors: Jian Hua Zhao, Shanghai (CN); Wadeo Ou, Shanghai (CN)

(73) Assignee: STMicroelectronics R&D (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 13/854,395

(22) Filed: Apr. 1, 2013

(65) Prior Publication Data

US 2013/0222053 A1   Aug. 29, 2013

Related U.S. Application Data

(63) Continuation of application No. 13/617,701, filed on Sep. 14, 2012, now abandoned, which is a continuation of application No. 13/332,891, filed on Dec. 21, 2011, now abandoned.

(30) Foreign Application Priority Data

Dec. 31, 2010   (CN) .......................... 2010 1 0624783

(51) Int. Cl.
*H03K 3/00*   (2006.01)
*H03G 3/00*   (2006.01)
*H03G 3/30*   (2006.01)

(52) U.S. Cl.
CPC .............. *H03G 3/004* (2013.01); *H03G 3/002* (2013.01); *H03G 3/3089* (2013.01)
USPC ................................ 327/108; 327/59; 326/82

(58) Field of Classification Search
USPC ............. 327/59, 63, 68, 108–112; 326/82, 83
See application file for complete search history.

(56) References Cited

U.S. PATENT DOCUMENTS

| | | | |
|---|---|---|---|
| 4,751,403 A * | 6/1988 | Maekawa et al. ............. | 327/108 |
| 5,568,068 A * | 10/1996 | Ota et al. ......................... | 326/82 |
| 7,764,085 B2 * | 7/2010 | Takahashi et al. .............. | 326/82 |
| 7,804,345 B2 * | 9/2010 | Koh et al. ..................... | 327/170 |
| 7,859,300 B2 * | 12/2010 | Kibune ........................... | 326/33 |
| 8,130,012 B2 * | 3/2012 | Kwon et al. .................. | 327/108 |
| 8,487,687 B2 * | 7/2013 | Hsu et al. ...................... | 327/321 |
| 8,638,149 B1 * | 1/2014 | Kossel et al. ................. | 327/170 |
| 8,643,404 B1 * | 2/2014 | Chaung et al. ............... | 327/108 |
| 8,716,993 B2 * | 5/2014 | Kadanka ...................... | 323/274 |
| 2007/0103208 A1 * | 5/2007 | Huang et al. ................. | 327/108 |

* cited by examiner

*Primary Examiner* — William Hernandez
(74) *Attorney, Agent, or Firm* — Gardere Wynne Sewell LLP

(57) ABSTRACT

Circuits and methods to realize a power-efficient high frequency buffer. The amplitude of a buffered signal is detected and compared with the amplitude of the input signal. The comparison result can be fed back to the digitally-controlled buffer to keep the output gain constant. By using feedback control, the buffer can be kept at the most suitable biasing condition even if the load condition or signal frequency varies.

16 Claims, 6 Drawing Sheets

HIGH FREQUENCY SMART BUFFER

CROSS REFERENCE TO RELATED APPLICATIONS

This application is a continuation of U.S. patent application Ser. No. 13/617,701, filed on Sep. 14, 2012, which application is a continuation of U.S. patent application Ser. No. 13/332,891, filed on Dec. 21, 2011 which application claims the priority benefit of Chinese patent application number 201010624783.2, filed on Dec. 31, 2010, which applications are hereby incorporated by reference to the maximum extent allowable by law.

BACKGROUND

1. Technical Field

The techniques described herein relate to signal buffers and in particular to a high frequency smart buffer.

2. Discussion of the Related Art

In previous versions of a high frequency buffer, the push-pull output buffer is biased at a fixed condition. This makes the trade-off difficult in circuit design. If the biasing of the buffer is low then the buffer can not drive a heavy capacitive load at high frequency. If the biasing current is high it wastes current when the output capacitance to be driven is low.

SUMMARY

Described herein are circuits and methods to realize a power efficient high frequency buffer. The amplitude of a buffered signal can be detected and compared with the amplitude of the input signal. The comparison result is fed back to the buffer to keep the output gain substantially constant. By using feedback control, the buffer can be kept at the most suitable biasing condition even if the load condition or signal frequency varies.

Some embodiments relate to a circuit that includes a buffer that receives an input signal and produces an output signal; a comparison circuit that compares the input signal with the output signal to produce a comparison result; and a control logic circuit that controls the buffer based on the comparison result to limit an amount of current used by the buffer.

The foregoing is a non-limiting summary of some embodiments of the techniques described herein.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

DETAILED DESCRIPTION

The smart buffer architecture as described herein allows a common buffer to be used at different load/frequency conditions without wasting current or causing a performance drop. No external components are needed, so the system complexity does not increase.

Figure 1:
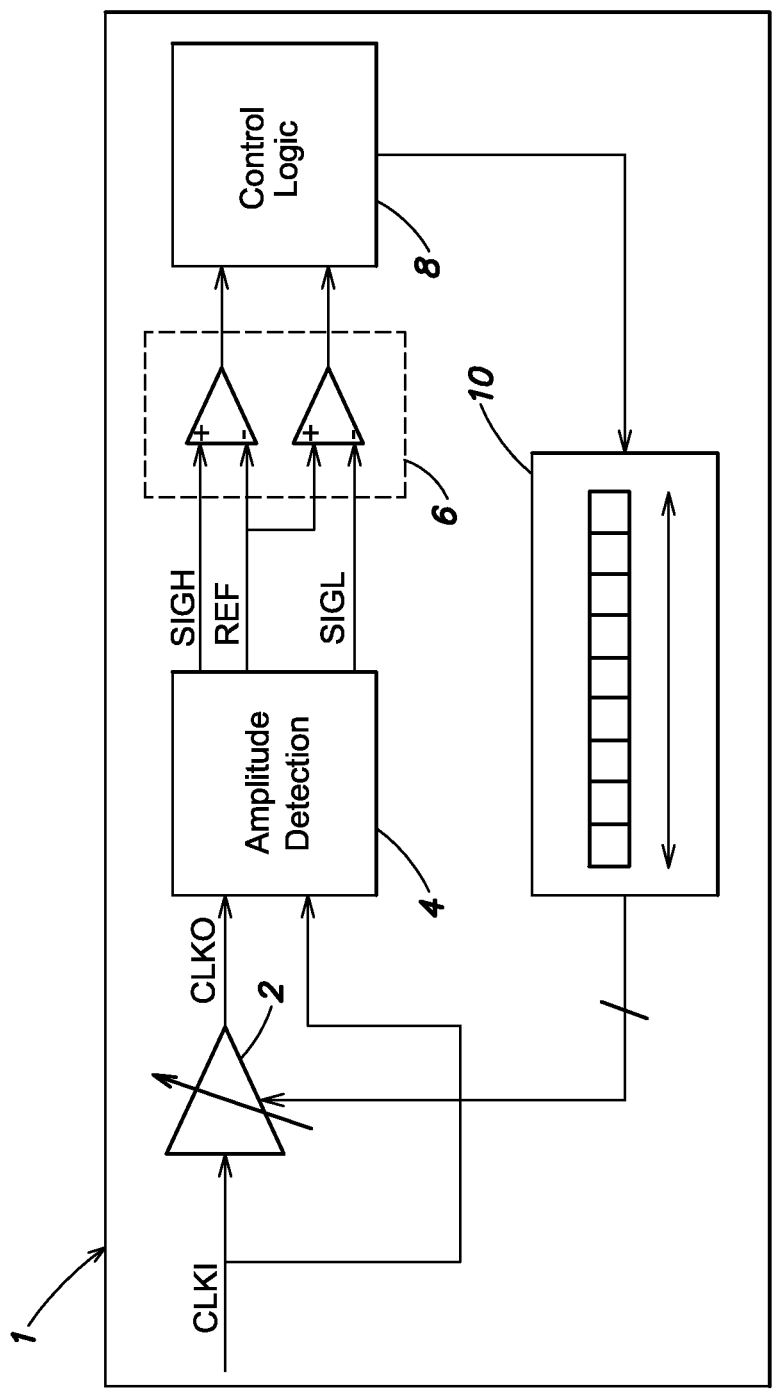
FIG. 1 shows a block diagram of a smart buffer circuit.

As shown in FIG. 1, the smart buffer circuit 1 includes a high frequency buffer 2 with multiple current legs that may be turned on or off, an amplitude comparison circuit 4, a dual-comparator circuit 6, a control logic circuit 8 and bi-directional shift registers 10. The one or more shift registers 10 can control the current legs in the buffer 2 to be on or off, thus closing the feedback loop.

When there is an input signal, for example a clock signal CLKI from a crystal oscillator, the high frequency buffer 2 generates a similar output signal CLKO with a certain amount of attenuation, depending on the load condition and the frequency of the input signal. Both the input clock and output clock signals are fed into the amplitude comparison circuit 4 to generate three voltages:

$$V_{SIGH} = \frac{V_{PPout}}{2} + \Delta V_H$$

$$V_{SIGL} = \frac{V_{PPout}}{2} + \Delta V_L$$

$$V_{REF} = \frac{V_{PPin}}{2}$$

In which $\Delta V_H$ is higher than $\Delta V_L$. The three voltages are fed into the dual-comparator circuit 6. The control logic circuit 8 controls the shift registers 10 depending on the comparison result. If $V_{SIGH} < V_{REF}$, it indicates the amplitude of the output signal CLKO is too low, and the control logic 8 right shifts the register 10 by 1 bit so that one more current leg is turned on. If $V_{SIGL} > V_{REF}$, it indicates that the amplitude of the output signal CLKO is unnecessarily high, and the control logic left shifts the register by 1 bit so that one current leg turns off. If $V_{SIGH} > V_{REF} > V_{SIGL}$, it indicates the amplitude of the output signal CLKO has appropriate attenuation, and the state of the shift register does not change.

As a result, the smart buffer can be controlled so that the desired performance can be achieved without wasting current/power.

Figure 2:
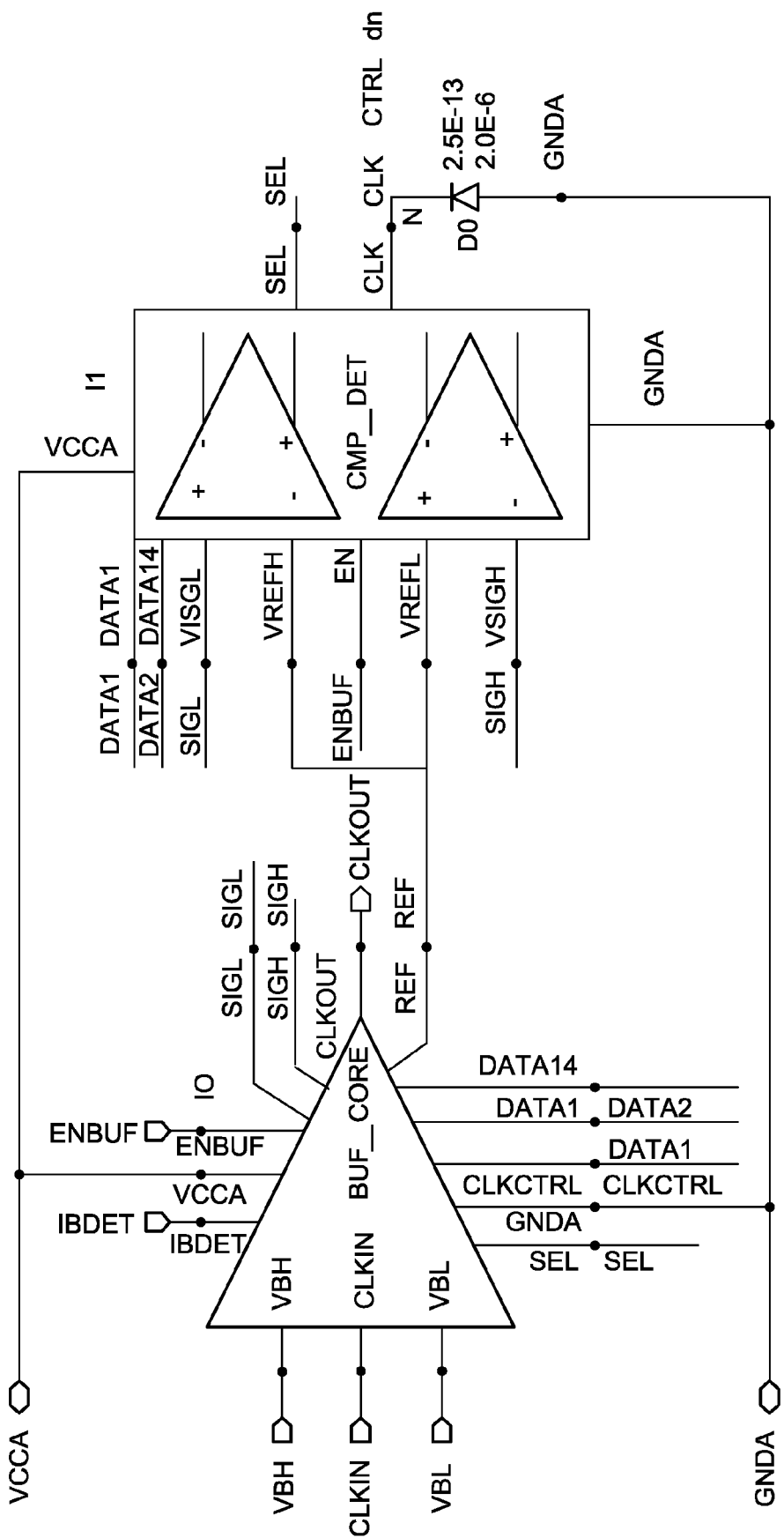
FIGS. 2-4 show more detailed schematics of the smart buffer circuit of FIG. 1.
Figure 3A:
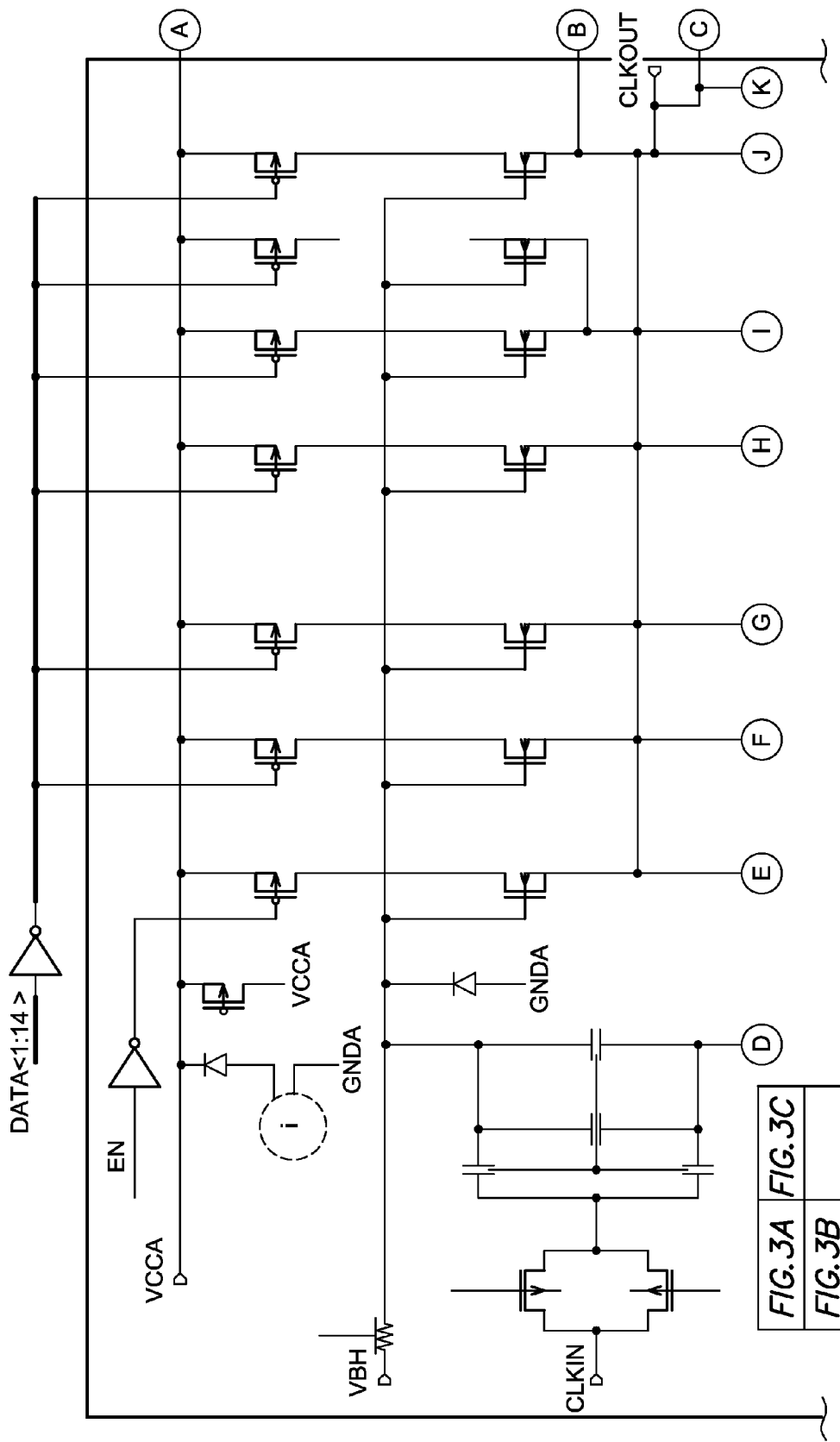
Figure 3B:
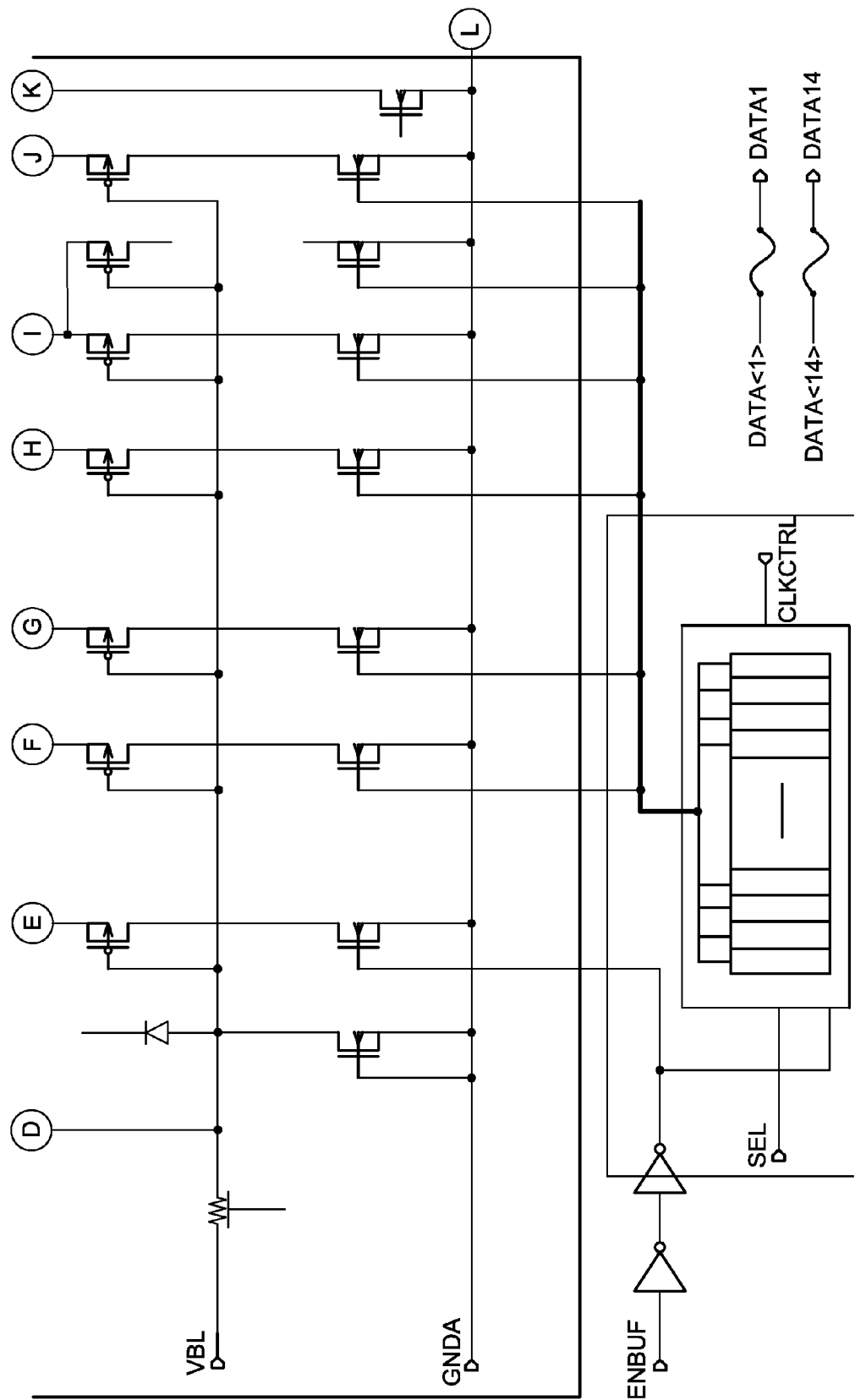
Figure 3C:
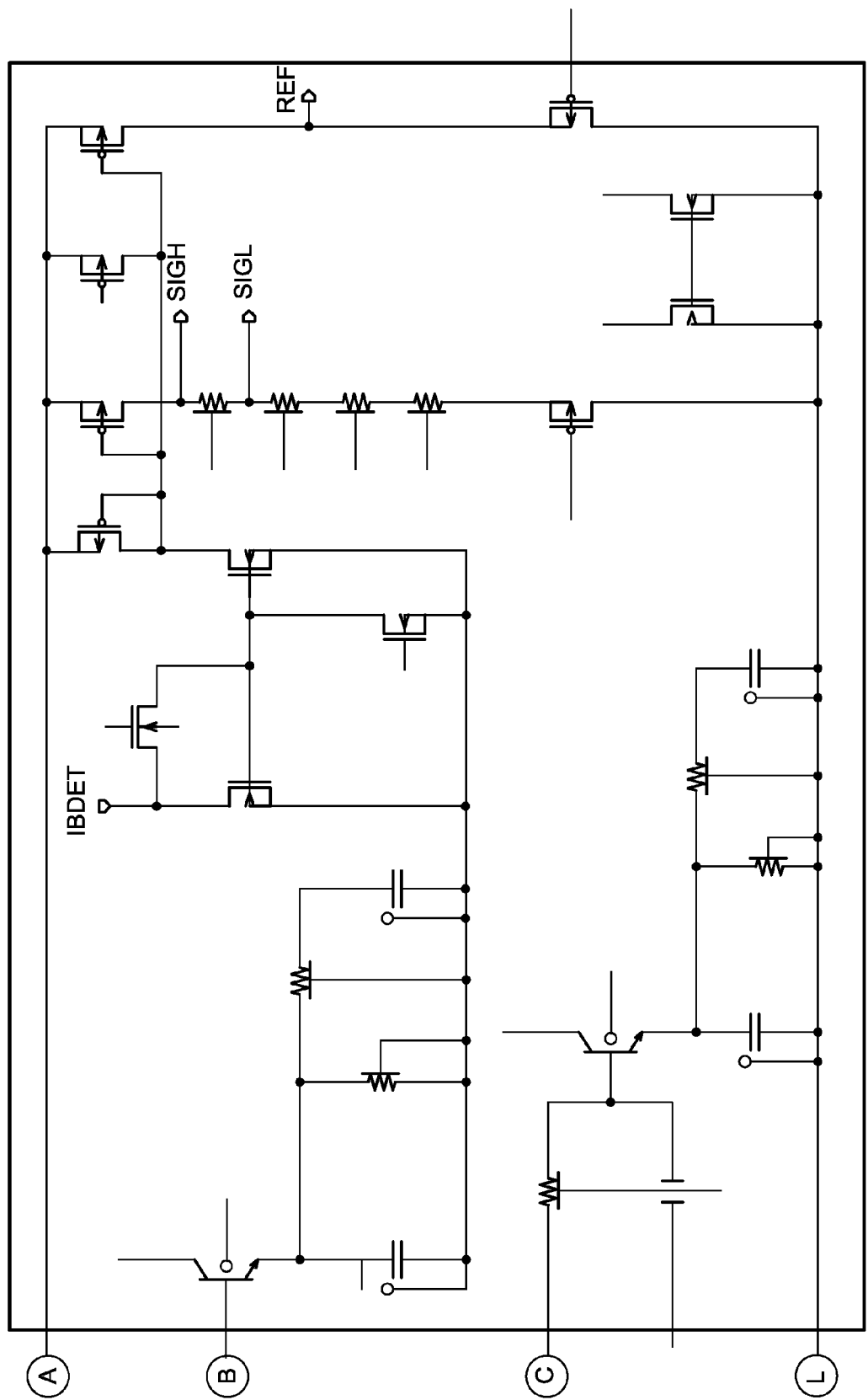
Figure 4:
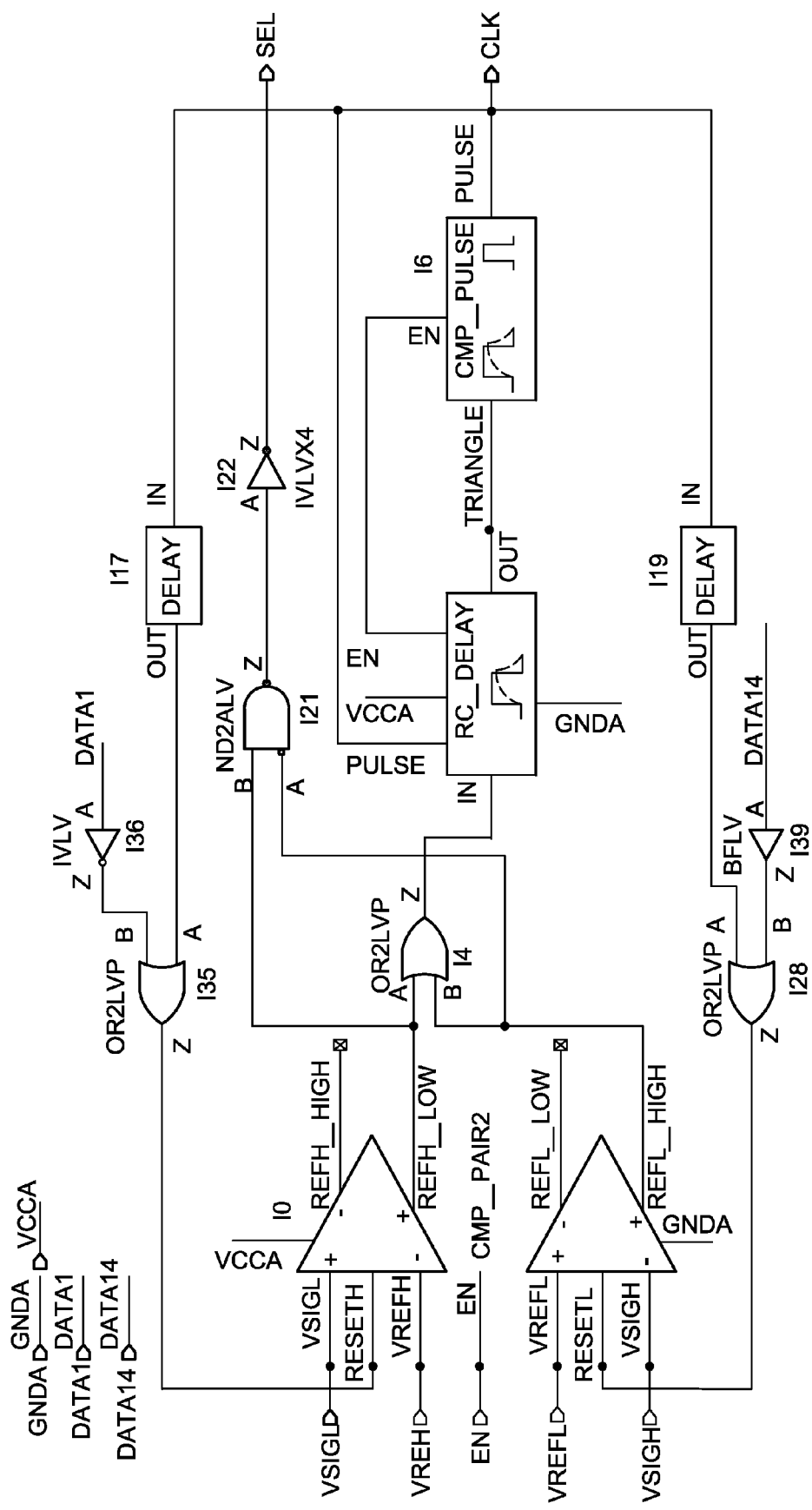

One example schematic of the buffer circuit is shown in FIGS. 2-4.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A circuit, comprising:
   a buffer that receives an input signal and produces an output signal;
   a comparison circuit that compares an amplitude of the input signal with the output signal to produce a comparison result indicating whether the amplitude of the output signal is too high, to low or has appropriate attenuation; and a control logic circuit that controls the buffer based on the comparison result to limit an amount of current used by the buffer.

2. The circuit of claim 1, further comprising:
a shift register that controls one or more current legs of the buffer to be turned on and off, based on the comparison result.

3. The circuit of claim 1, wherein when the output signal is too low, the control logic circuit controls the buffer to draw more current.

4. The circuit of claim 3, wherein when the output signal is too low, the control logic circuit controls an additional current leg of the buffer to be turned on.

5. The circuit of claim 1, wherein when the output signal is too high, the control logic circuit controls the buffer to draw less current.

6. The circuit of claim 5, wherein when the output signal is too high, the control logic circuit controls a current leg of the buffer to be turned off.

7. A circuit, comprising:
a buffer that receives an input signal and produces an output signal, wherein the buffer has multiple current legs that may be selectively turned on and off;
a comparison circuit configured to compare the input signal with the output signal and produce a comparison result;
a shift register; and
a control logic circuit configured to control the shift register based on the comparison result so that output from the shift register is configured to control one or more current legs of the multiple current legs to be turned on and off.

8. The circuit of claim 7, wherein when the comparison result indicates that the output signal is too low, the control logic circuit controls the buffer to draw more current.

9. The circuit of claim 7, wherein when the comparison result indicates that the output signal is too low, the control logic circuit causes the shift register to actuate an additional current leg of the buffer.

10. The circuit of claim 7, wherein when the comparison result indicates that the output signal is too high, the control logic circuit controls the buffer to draw less current.

11. The circuit of claim 7, wherein when the comparison result indicates that the output signal is too high, the control logic circuit causes the shift register to deactivate a current leg of the buffer.

12. A circuit, comprising:
a buffer that receives an input signal and produces an output signal, wherein the buffer has multiple current legs that may be selectively turned on and off;
a comparison circuit that compares an amplitude of the input signal with the output signal to produce a comparison result;
a shift register configured to control the current legs of the buffer to be turned on and off; and
a control logic circuit that configures the shift register based on the comparison result.

13. The circuit of claim 12, wherein the control logic circuit controls the buffer to draw more current when the comparison result indicates that the output signal is too low.

14. The circuit of claim 13, wherein, when the output signal is too low, the control logic circuit controls the shift register to turn on a current leg of the buffer.

15. The circuit of claim 12, wherein the control logic circuit controls the buffer to draw less current when the comparison result indicates that the output signal is too high.

16. The circuit of claim 15, wherein, when the output signal is too high, the control logic circuit controls the shift register to turn off a current leg of the buffer.

\* \* \* \* \*